US009391029B2

(12) United States Patent
Hayashiyama et al.

(10) Patent No.: US 9,391,029 B2
(45) Date of Patent: Jul. 12, 2016

(54) ELECTRONIC DEVICE

(71) Applicant: Kabushiki Kaisha Toshiba, Tokyo (JP)

(72) Inventors: Shinya Hayashiyama, Tachikawa Tokyo (JP); Hirofumi Morita, Higashiyamoto Tokyo (JP); Tomokazu Yuasa, Akishima Tokyo (JP); Tomofumi Miyamoto, Hamura Tokyo (JP); Daisuke Maehara, Ome Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,651

(22) Filed: Feb. 27, 2015

(65) Prior Publication Data

US 2015/0364428 A1     Dec. 17, 2015

Related U.S. Application Data

(60) Provisional application No. 62/011,426, filed on Jun. 12, 2014.

(51) Int. Cl.
*H01L 23/552*     (2006.01)
*H01L 23/538*     (2006.01)
*H01L 23/492*     (2006.01)
(Continued)

(52) U.S. Cl.
CPC .............. *H01L 23/552* (2013.01); *H01L 23/04* (2013.01); *H01L 23/492* (2013.01); *H01L 23/5389* (2013.01); *H01L 24/16* (2013.01); *H01L 24/32* (2013.01); *H01L 24/73* (2013.01); *H01L 2224/16225* (2013.01); *H01L 2224/32245* (2013.01); *H01L 2224/73253* (2013.01); *H01L 2924/1432* (2013.01); *H01L 2924/15311* (2013.01); *H01L 2924/15321* (2013.01); *H01L 2924/164* (2013.01); *H01L 2924/1627* (2013.01); *H01L 2924/1631* (2013.01); *H01L 2924/1632* (2013.01); *H01L 2924/16195* (2013.01); *H01L2924/16196* (2013.01); *H01L 2924/16235* (2013.01); *H01L 2924/16315* (2013.01)

(58) Field of Classification Search
CPC .............. H01L 23/552; H01L 23/0657; H01L 23/5389; H01L 23/492; H01L 25/0657; H01L 2225/06572; H01L 2225/06517; H01L 2225/0652; H01L 2225/06555
See application file for complete search history.

(56) References Cited

U.S. PATENT DOCUMENTS 6,490,161 B1 * 12/2002 Johnson .............. H01L 23/4006
                                                                                      165/185
2008/0272483 A1 * 11/2008 Oman .................. H01L 23/3128
                                                                                      257/712

(Continued)

FOREIGN PATENT DOCUMENTS

JP     2010-272774     12/2010
JP     2011-103368     5/2011
(Continued)

*Primary Examiner* — Peniel M Gumedzoe
(74) *Attorney, Agent, or Firm* — Rutan & Tucker, LLP; William W. Schaal

(57) ABSTRACT

According to one embodiment, an electronic device includes a first substrate, a second substrate, an electronic component and a first shield. The first substrate includes a first surface, a second surface, and an aperture. The second substrate includes a third surface fixed to the second surface. The electronic component is mounted on the third surface, passes through the aperture and protrudes from the first surface. The first shield includes a first portion facing the component protruding from the first surface, and second portions which extend from the first portion, are fixed to the first surface and face corner portions of the third surface respectively.

11 Claims, 10 Drawing Sheets

(51) Int. Cl.
*H01L 23/04* (2006.01)
*H01L 23/00* (2006.01)

(56) References Cited

U.S. PATENT DOCUMENTS

2012/0075807 A1* 3/2012 Refai-Ahmed ......... H01L 23/13
361/719

| 2013/0016289 | A1 | 1/2013 | Hayashiyama et al. |
| 2013/0077252 | A1* | 3/2013 | Ju ........................... H01L 23/36 |
| | | | 361/714 |

FOREIGN PATENT DOCUMENTS

JP 2012-178408 9/2012
JP 2013-026633 2/2013

* cited by examiner

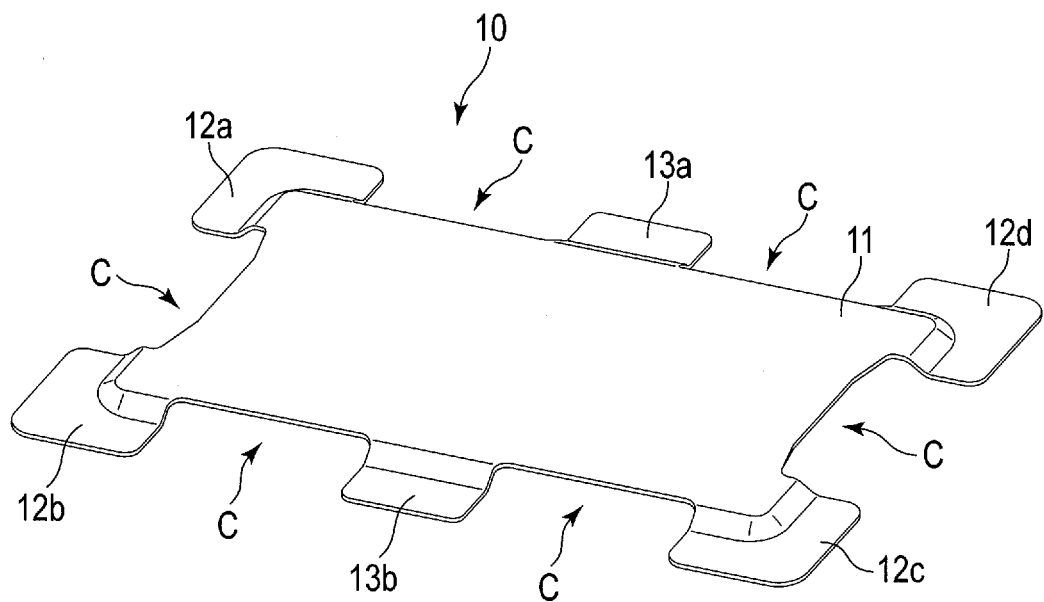
F I G. 5
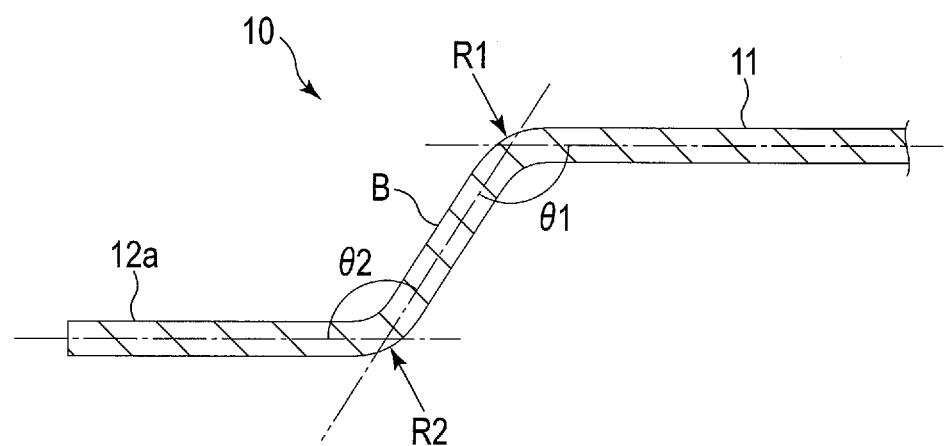
F I G. 6

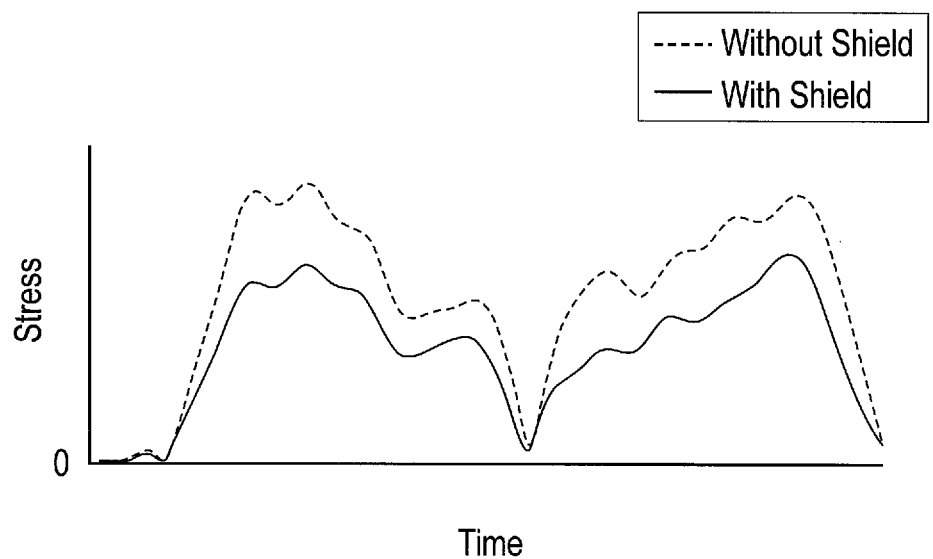
F I G. 10
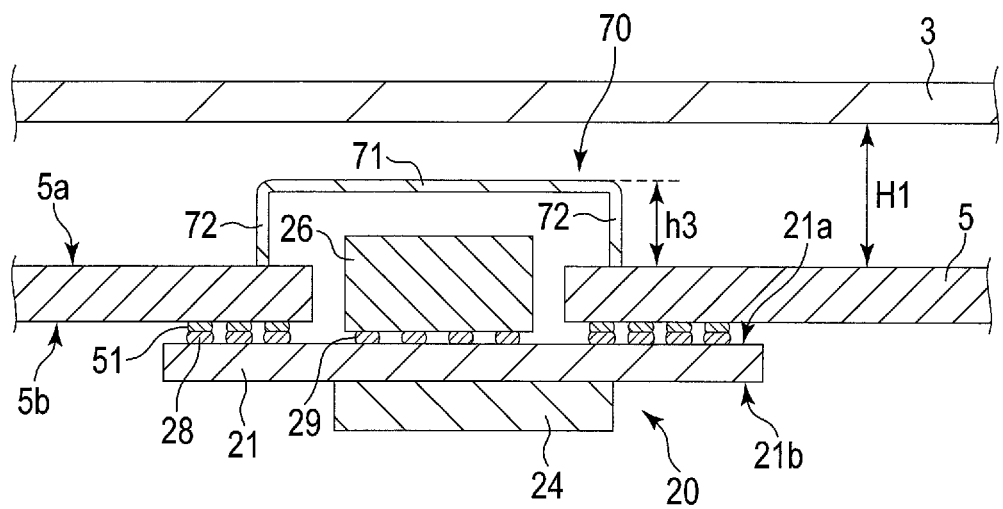
F I G. 11

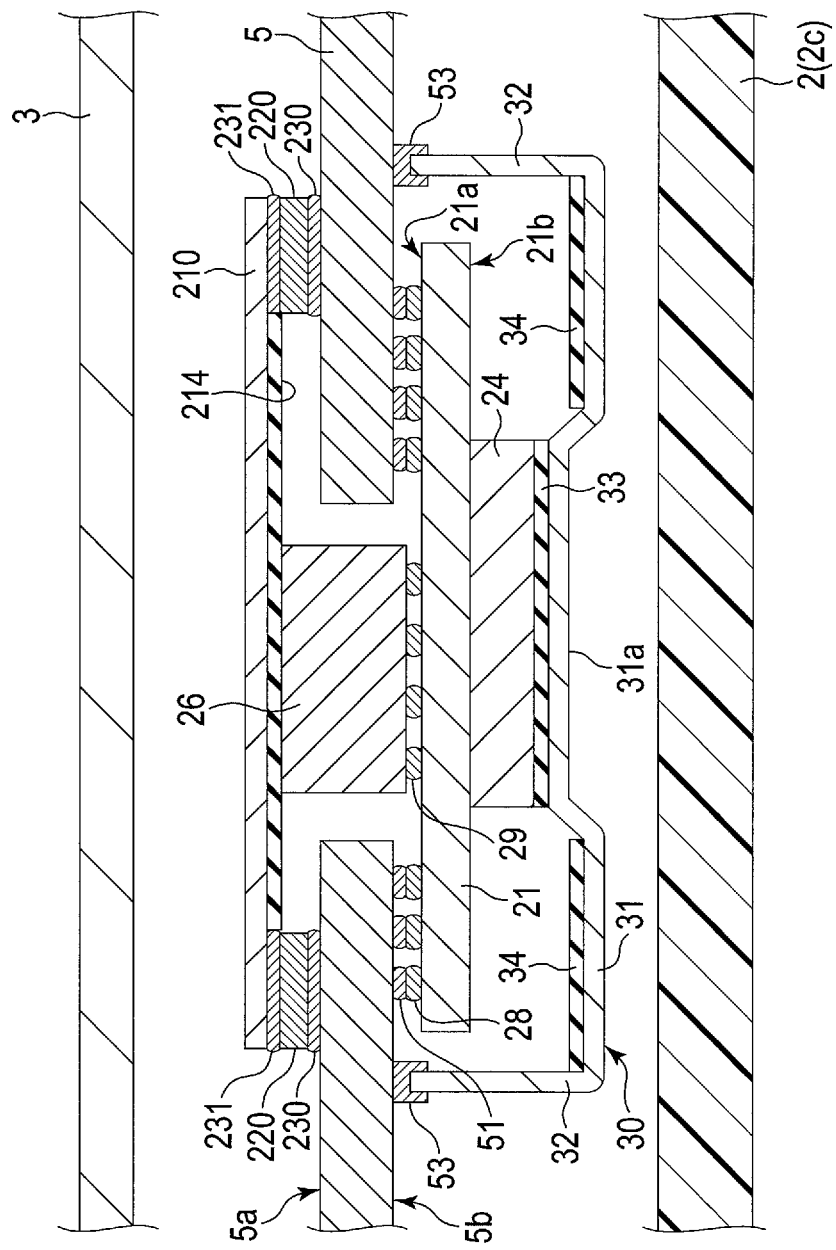
F I G. 12

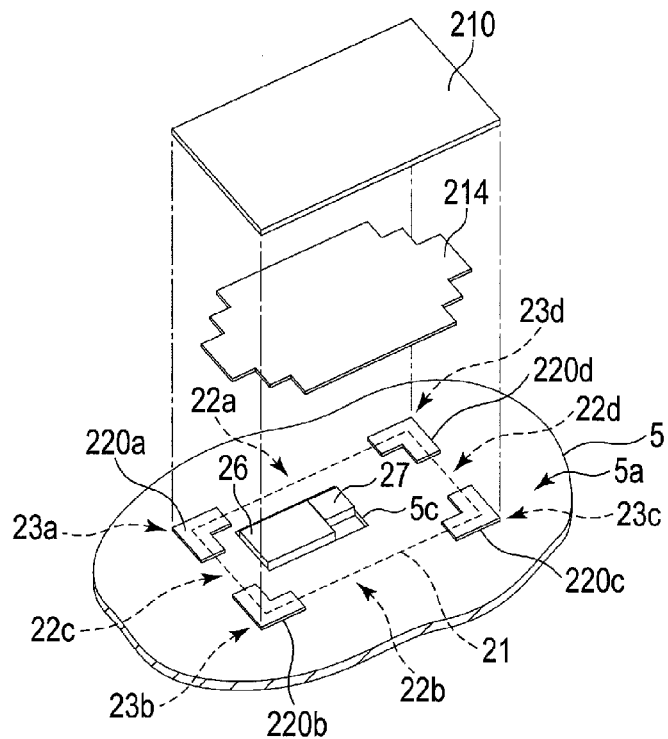
F I G. 13
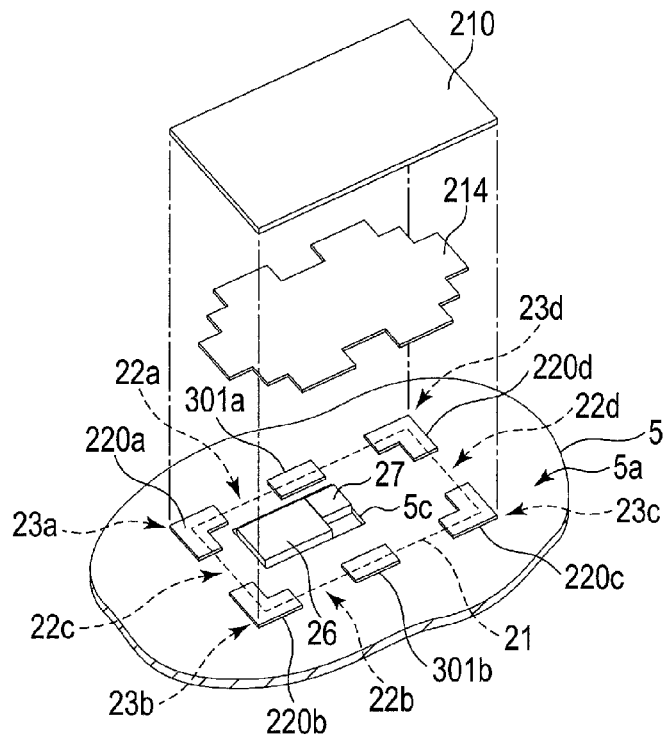
F I G. 14

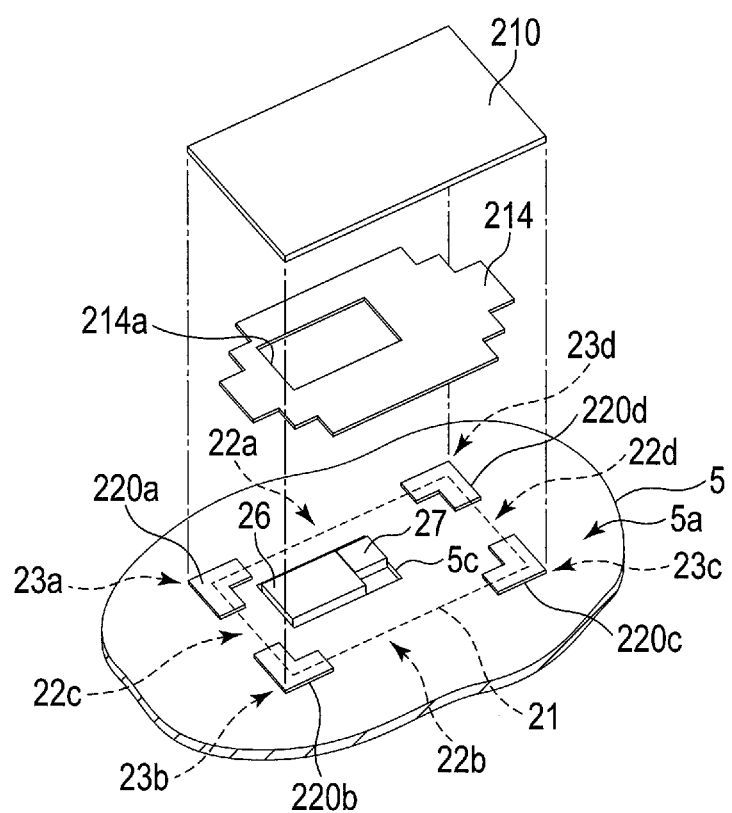
F I G. 15

ELECTRONIC DEVICE

CROSS-REFERENCE TO RELATED APPLICATIONS

This application claims the benefit of U.S. Provisional Application No. 62/011,426, filed Jun. 12, 2014, the entire contents of which are incorporated herein by reference.

FIELD

Embodiments described herein relate generally to an electronic device.

BACKGROUND

In electronic devices, there is demand for improvement in impact resistance and electromagnetic compatibility (EMC).

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 5 schematically shows an example of a first shield provided in the electronic device.

FIG. 6 schematically shows a part of a cross-sectional surface of the first shield.

FIG. 10 shows an analysis example of the stress applied when an impact is added to the electronic device.

FIG. 11 shows an example of comparison with the first embodiment.

FIG. 12 schematically shows an example of the inner structure of an electronic device according to a second embodiment.

FIG. 13 shows a structural example of vicinity of an aperture portion of a first substrate provided in the electronic device according to the second embodiment.

FIG. 14 shows a structural example of vicinity of an aperture portion of a first substrate provided in an electronic device according to a third embodiment.

FIG. 15 shows a structural example of vicinity of an aperture portion of a first substrate provided in an electronic device according to a fourth embodiment.

DETAILED DESCRIPTION

Various embodiments will be described hereinafter with reference to the accompanying drawings.

In general, according to one embodiment, an electronic device includes a first substrate, a second substrate, an electronic component and a first shield. The first substrate comprises a first surface, a second surface located on a side opposite to the first surface, and an aperture portion penetrating from the first surface to the second surface. The second substrate comprises a third surface fixed to the second surface, the third surface comprising a plurality of corner portions. The electronic component is mounted on the third surface, passes through the aperture portion and protrudes from the first surface. The first shield comprises a first portion facing the electronic component protruding from the first surface, and a plurality of second portions which extend from the first portion, are fixed to the first surface and face the plurality of corner portions respectively with the first substrate being interposed. The first shield is formed of a conductive material.

First Embodiment

One embodiment of an electronic device is explained in detail. In this embodiment, a tablet computer is disclosed as an example of the electronic device. However, the electronic device is not limited to a tablet computer, and may be a notebook computer, a smartphone, a mobile game console, a PDA, a digital camera, or various other types of devices.

Figure 1:
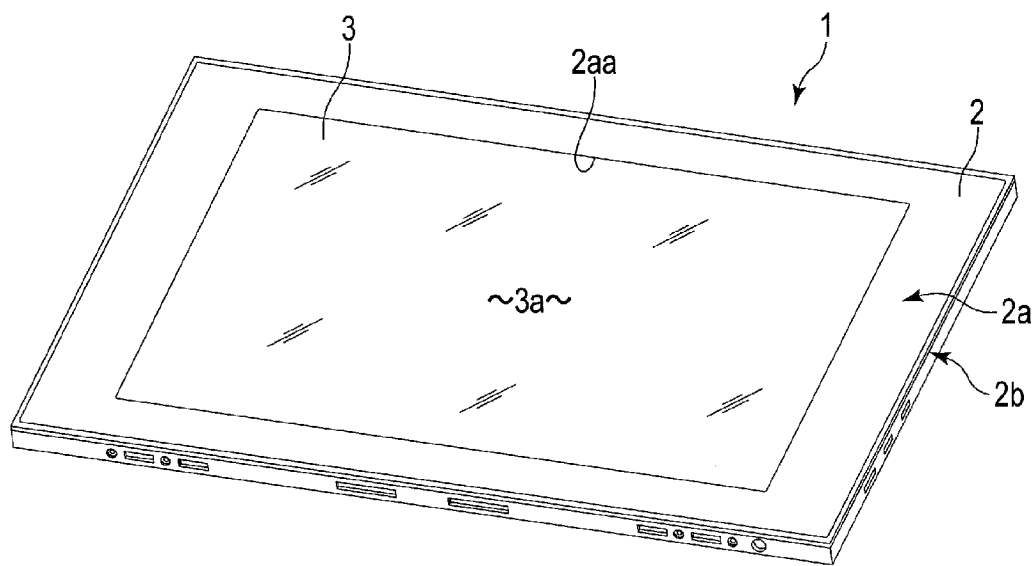
FIG. 1 schematically shows an example of the external appearance of an electronic device according to a first embodiment.

FIG. 1 schematically shows an example of the external appearance of a tablet computer 1 according to the present embodiment. The tablet computer 1 comprises a housing 2 and a display 3 accommodated in the housing 2. The housing 2 is formed in the shape of a flat box from a synthetic resin such as plastic. Specifically, the housing 2 comprises a front wall 2a, a back wall 2c located on a side opposite to the front wall 2a (see FIG. 7), and a peripheral wall 2b extending between the front wall 2a and the back wall 2c. The front wall 2a comprises, for example, an opening portion 2aa which is rectangular.

The display 3 comprises a screen 3a exposed through the opening portion 2aa. The display 3 comprises, for example, a display panel which displays an image on the screen 3a, and a touchpanel which is stacked on the display panel and detects the position of the user's finger contacting or coming close to the screen 3a. For example, a liquid crystal display element or an organic electroluminescent display element is applicable to the display element of the display panel. For example, a capacitance method is applicable to the detection method of the touchpanel. The display 3 may further comprise a digitizer which detects the position of a pointing device contacting or coming close to the screen 3a. For example, an electromagnetic induction exchange method is applicable to the detection method of the digitizer.

Figure 2:
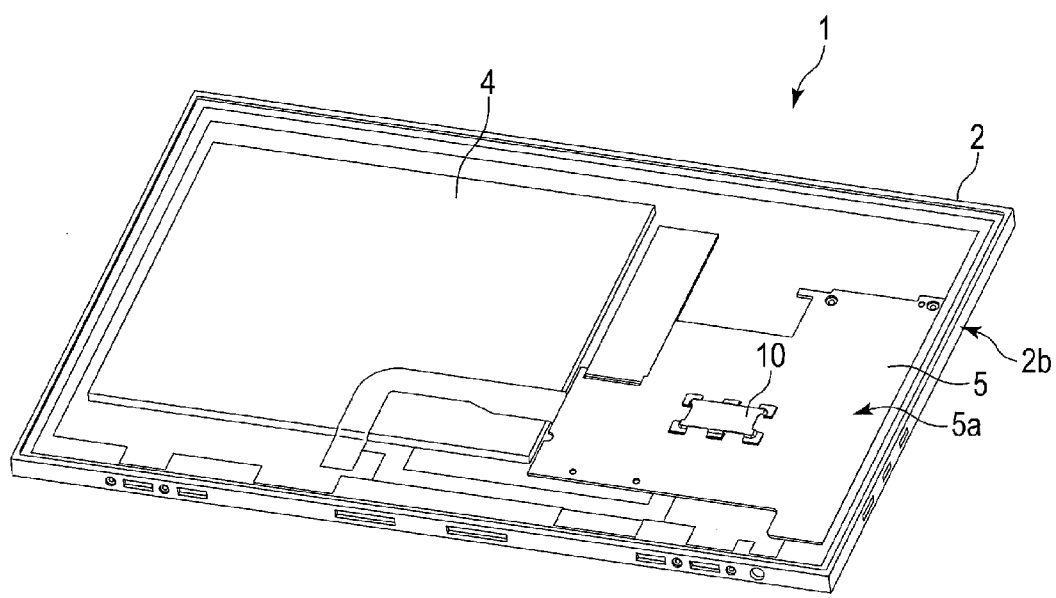
FIG. 2 schematically shows an example of the inner structure of the electronic device.

FIG. 2 schematically shows an example of the inner structure of the tablet computer 1. Neither the front wall 2a of the housing 2 nor the display 3 is shown in FIG. 2. The tablet computer 1 comprises a battery 4 and a first substrate 5 inside the housing 2. The first substrate 5 is also referred to as, for example, a circuit board or a main board, and is electrically connected to the display 3, the battery 4 and the like. The battery 4 has a flat shape, and supplies power to the display 3, the first substrate 5 and the like.

The first substrate 5 comprises a first surface 5a facing the back surface of the display 3 (in other words, facing the surface located on a side opposite to the screen 3a). A first shield 10 is provided on the first surface 5a.

Figure 3:
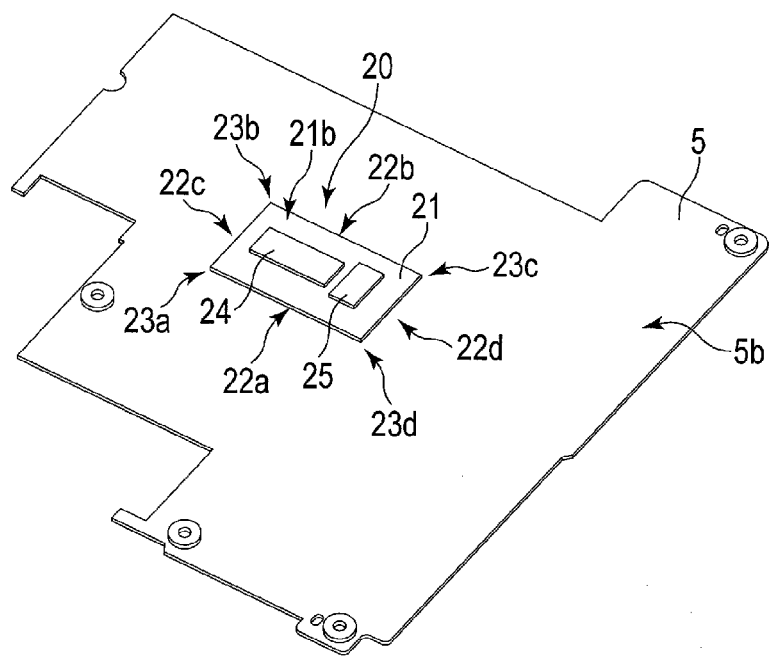
FIG. 3 schematically shows an example of a second surface of a first substrate provided in the electronic device.
Figure 4:
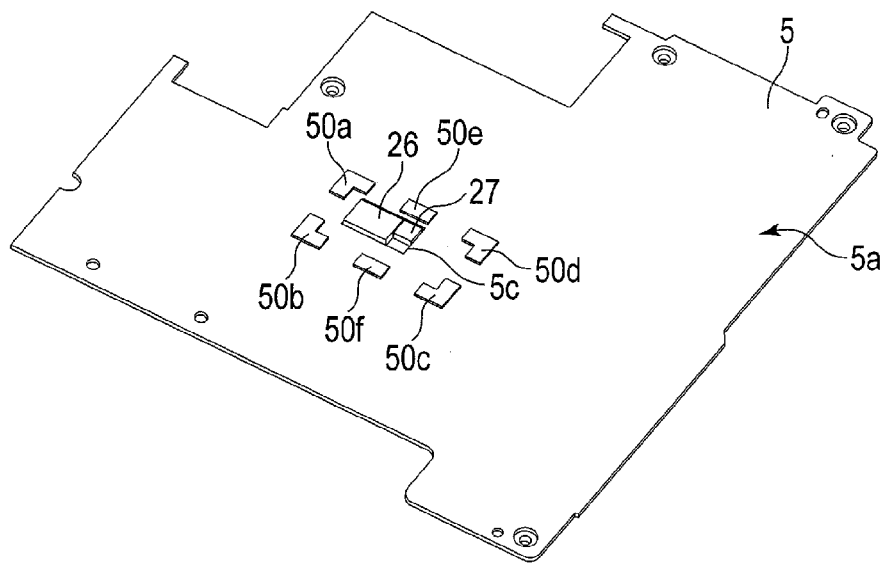
FIG. 4 schematically shows an example of a first surface of the first substrate.

FIG. 3 schematically shows an example of a second surface 5b of the first substrate 5. The second surface 5b is located on a side opposite to the first surface 5a. FIG. 4 schematically shows the first surface 5a of the first substrate 5 from which the first shield 10 is removed. As shown in FIG. 3, a package 20 is mounted on the second surface 5b. The package 20 is an example of a semiconductor portion, a semiconductor mounting portion, a component mounting portion, a chip portion, a chip mounting portion or a substrate portion.

The package 20 comprises a second substrate 21. The second substrate 21 is also referred to as a circuit board or a board. The second substrate 21 comprises a plurality of side portions and a plurality of corner portions structured by these side portions.

In the example of FIG. 3, the second substrate 21 is rectangular, and comprises four side portions 22a, 22b, 22c and 22d and four corner portions 23a, 23b, 23c and 23d structured by the four side portions. Side portions 22a and 22b extend parallel to one another. Side portions 22c and 22d extend parallel to one another. Side portions 22a and 22b are long-side portions which are longer than side portions 22c and 22d. Side portions 22c and 22d are short-side portions which are shorter than side portions 22a and 22b. Corner portion 23a is structured by side portions 22a and 22c. Corner portion 23b is structured by side portions 22c and 22b. Corner portion 23c is structured by side portions 22b and 22d. Corner portion 23d is structured by side portions 22d and 22a. All of these corner portions are right angled.

The second substrate 21 comprises a third surface 21a facing the second surface 5b of the first substrate 5 (see FIG. 7), and a fourth surface 21b located on a side opposite to the third surface 21a and facing the back wall 2c of the housing 2. As shown in FIG. 3, a first electronic component 24 and a second electronic component 25 are mounted on the fourth surface 21b.

As shown in FIG. 4, the first substrate 5 comprises pad 50 on the first surface 5a. Pad 50 is provided in the position where the first shield 10 is allocated. Pad 50 is electrically connected to, for example, the first surface 5a. In the example of FIG. 4, pads 50a, 50b, 50c and 50d are provided in the positions facing corner portions 23a, 23b, 23c and 23d of the second substrate 21 respectively with the first substrate 5 being interposed. Each of pads 50a, 50b, 50c and 50d is L-shaped. In the example of FIG. 3, pads 50e and 50f are provided in the positions facing side portions 22a and 22b which are the long-side portions of the second substrate 21 respectively with the first substrate 5 being interposed. Pad 50e is located between pads 50a and 50d. Pad 50f is located between pads 50b and 50c.

As shown in FIG. 4, the first substrate 5 comprises an aperture portion (first aperture portion) 5c which penetrates from the first surface 5a to the second surface 5b. The aperture portion 5c is located within the range surrounded by pads 50a, 50b, 50c, 50d, 50e and 50f.

The second substrate 21 comprises a third electronic component 26 and a fourth electronic component 27 in addition to the above-described first electronic component 24 and second electronic component 25. The third electronic component 26 and the fourth electronic component 27 are mounted on the third surface 21a. The third electronic component 26 and the fourth electronic component 27 pass through the aperture portion 5c and protrude from the first surface 5a of the first substrate 5.

The first electronic component 24 and the second electronic component 25 are, for example, semiconductor chips (dies). For example, the first electronic component 24 is a central processing unit (CPU), and the second electronic component 25 is a chipset. The third electronic component 26 and the fourth electronic component 27 are, for example, integrated voltage regulators (IVRs) which control the voltage supplied to the first electronic component 24 and the second electronic component 25 depending on the processing load.

FIG. 5 schematically shows an example of the first shield 10. The first shield 10 comprises first portion 11 having a flat-plate shape, and second portion 12 extending from first portion 11. In the example of FIG. 5, first portion 11 is substantially rectangular. L-shaped second portions 12a, 12b, 12c and 12d extend from the vicinity of four corner portions of first portion 11 respectively.

The first shield 10 comprises third portion 13 extending from first portion 11 between two adjacent second portions 12. In the example of FIG. 5, third portion 13a which is rectangular extends from first portion 11 (in the middle point) between second portions 12a and 12d. Third portion 13b which is rectangular extends from first portion 11 (in the middle point) between second portions 12b and 12c. As another embodiment, third portion 13 may extend from first portion 11 between second portions 12a and 12b or between second portions 12c and 12d. A plurality of third portions 13 may extend from first portion 11 between two second portions 12.

Second portions 12a, 12b, 12c and 12d, and third portions 13a and 13b extend from one of main surfaces of first portion 11 in positions away in the normal direction of said one of the main surfaces (in the thickness direction of first portion 11).

Gap C is formed each between second portion 12a and second portion 12b, between second portion 12b and third portion 13b, between third portion 13b and second portion 12c, between second portion 12c and second portion 12d, between second portion 12d and third portion 13a, and between third portion 13a and second portion 12a.

FIG. 6 schematically shows a part of a cross-sectional surface of the first shield 10. FIG. 6 shows first portion 11, second portion 12a, and border portion B extending between first portion 11 and second portion 12a. First portion 11 and border portion B are smoothly connected along, for example, the circular arc of radius R1. On the other hand, second portion 12a and border portion B are smoothly connected along, for example, the circular arc of radius R2.

Border portion B inclines at substantially angle $\theta 1$ with respect to first portion 11, and inclines at substantially angle $\theta 2$ with respect to second portion 12a. Each of angles $\theta 1$ and $\theta 2$ is an obtuse angle. For example, radius R1 is greater than radius R2 (R1>R2), and angle $\theta 1$ is greater than angle $\theta 2$ ($\theta 1 > \theta 2$). Border portion B extending between first portion 11 and each of second portions 12b, 12c and 12d, and border portion B extending between first portion 11 and each of third portions 13a and 13b have the same radius R1, radius R2, angle $\theta 1$ and angle $\theta 2$ as border portion B extending between first portion 11 and second portion 12a.

First portion 11, second portions 12a, 12b, 12c and 12d, and third portions 13a and 13b are (in other words, the first shield 10 is) integrally formed by a conductive material whose coefficient of linear expansion is close to that of the first substrate 5. As this material, a metallic material such as stainless steel (SUS) or nickel silver (an alloy of copper, zinc and nickel) can be used. The first shield 10 can be formed by, for example, a drawing process. For example, in the drawing process, the first shield 10 is manufactured by placing a metallic material having a flat-plate shape in a die having a die hole having the shape of first portion 11, pressing the metallic material by a blank holder which opens in a shape corresponding to the die hole, pushing a punch corresponding to the die hole into the die hole through the opening of the blank holder.

Figure 7:
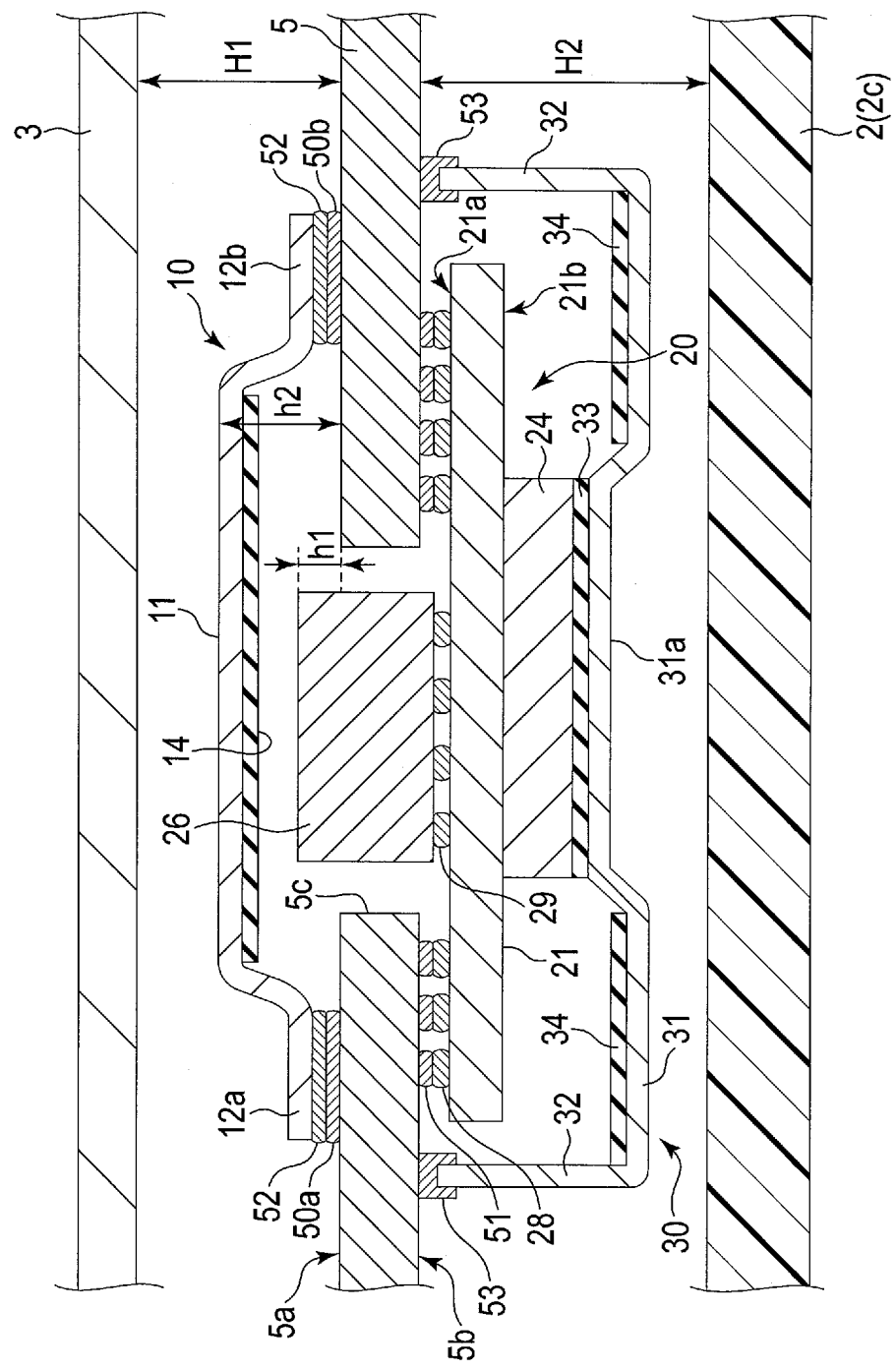
FIG. 7 shows an example of the surrounding structure of a package provided in the electronic device.

Now, this specification explains an example of the surrounding structure of the package 20 mounted on the first substrate 5 accommodated in the housing 2. FIG. 7 is a cross-sectional view showing an example of the surrounding structure of the package 20. FIG. 7 schematically shows the width, thickness, length and shape of each portion.

In the example of FIG. 7, the first substrate 5 is provided between the back wall 2c of the housing 2 and the display 3. The height between the first surface 5a of the first substrate 5 and the display 3 is H1. The height between the second surface 5b of the first substrate 5 and the back wall 2c of the housing 2 is H2. For example, height H1 is less than height H2 (H1<H2).

The first substrate 5 comprises a large number of pads 51 on the second surface 5b. Pads 51 are arranged in a matrix around the aperture portion 5c. Each of pads 51 is electrically connected to the first substrate 5.

The second substrate 21 comprises a large number of bumps 28 arranged in a matrix on the third surface 21a. Bumps 28 are examples of coupling portions, connecting portions, soldering portions or soldering coupling portions. In the example of FIG. 7, bumps 28 are solder balls electrically connected to the second substrate 21, the first electronic component 24, the second electronic component 25 and the like via the third surface 21a. Each bump 28 is fixed to a corresponding pad 51. With this structure, the package 20 is attached to the first substrate 5. The first substrate 5 is electrically connected to each portion of the package 20 via each bump 28 and each pad 51.

The third electronic component 26 is fixed to the third surface 21a of the second substrate 21 via bumps 29 which are, for example, solder balls each having a smaller diameter than bump 28. The fourth electronic component 27 is also fixed to the third surface 21a of the second substrate 21 via bumps 29 although this structure is not shown in FIG. 7. The third electronic component 26 and the fourth electronic component 27 are electrically connected to the second substrate 21 via bumps 29.

The first shield 10 is attached to the first surface 5a of the first substrate 5 by fixing second portion 12a to pad 50a, fixing second portion 12b to pad 50b, fixing second portion 12c to pad 50c, fixing second portion 12d to pad 50d, fixing third portion 13a to pad 50e, and fixing third portion 13b to pad 50f. Second portions 12a, 12b, 12c and 12d, and third portions 13a and 13b are fixed to pads 50a, 50b, 50c, 50d, 50e and 50f respectively via, for example, solder 52. The example of FIG. 7 shows only second portions 12a and 12b, pads 50a and 50b, and the solder 52 provided between the second portions and the pads.

As described above, the third electronic component 26 passes through the aperture portion 5c and protrudes from the first surface 5a of the first substrate 5. The height from the first surface 5a to the upper surface of the third electronic component 26 is h1. Although not shown in the example of FIG. 7, the fourth electronic component 27 also passes through the aperture portion 5c and protrudes from the first surface 5a. The height from the first surface 5a to the upper surface of the fourth electronic component 27 is h1 as with the case of, for example, the third electronic component 26.

First portion 11 of the first shield 10 faces the third electronic component 26 and the fourth electronic component 27, leaving a gap between the first portion and the electronic components. The height from the first surface 5a of the first substrate 5 to the upper surface of the first shield 10 (the surface facing display 3) is h2.

In the example of FIG. 7, insulator 14 is provided between first portion 11 and the third electronic component 26 (the fourth electronic component 27). Insulator 14 is, for example, a sheet formed of an insulating resin material. First portion 11 has a surface facing the third electronic component 26 and the fourth electronic component 27. Insulator 14 is attached to the entire part of this surface of first portion 11. Insulator 14 prevents conduction between the first shield 10 and each of the third electronic component 26 and the fourth electronic component 27.

Elements provided in the package 20, such as the first electronic component 24, the second electronic component 25, the third electronic component 26 and the fourth electronic component 27, emit electromagnetic radiation when operated. The electromagnetic radiation may have a negative effect on the other electronic components provided in the tablet computer 1, electronic devices around the tablet computer 1, or human bodies. This problem is called, for example, electromagnetic interference (EMI).

Electromagnetic radiation emitted by the other components provided in the tablet computer 1 or electronic devices around the tablet computer 1 may have a negative effect on elements provided in the package 20, such as the first electronic component 24, the second electronic component 25, the third electronic component 26 and the fourth electronic component 27. This problem is called, for example, radio-frequency interference (RFI).

The first shield 10 has a function for improving electromagnetic compatibility (EMC) of the tablet computer 1 by preventing or reducing EMI and RFI. The first shield 10 formed of a conductive material blocks electromagnetic radiation from the package 20 to the outside, and electromagnetic radiation from the outside to the package 20.

In the example of FIG. 7, a second shield 30 is provided on the second surface 5b side of the first substrate 5. As with the first shield 10, the second shield 30 is formed of a conductive material. The second shield 30 can be formed by, for example, folding a metallic material such as stainless steel or nickel silver. The second shield 30 completely or partially covers the second substrate 21, the first electronic component 24 and the second electronic component 25.

The second shield 30 comprises first portion 31 facing the second substrate 21, the first electronic component 24 and the second electronic component 25, and second portion 32 extending from first portion 31 to the second surface 5b of the first substrate 5. Second portion 32 is provided continuously over, for example, the whole circumference of first portion 31. A guide 53 having a shape corresponding to second portion 32 is provided on the second surface 5b of the first substrate 5. The second shield 30 is fixed to the first substrate 5 by fitting second portion 32 in the guide 53. In FIG. 3, illustrations of the second shield 30 and the guide 53 are omitted.

For example, the guide 53 is provided in a position more distant from the aperture portion 5c than pads 50a, 50b, 50c, 50d, 50e and 50f. In other words, second portions 12a, 12b, 12c and 12d and third portions 13a and 13b of the first shield 10 are connected to the first surface 5a in a position closer to the aperture portion 5c than the position where the second shield 30 is connected to the second surface 5b.

First portion 31 of the second shield 30 comprises a recess 31a depressed toward the first electronic component 24. A cooling sheet 33 is provided between the recess 31a and the first electronic component 24. The cooling sheet 33 is formed of, for example, an insulating resin material which has excellent thermal conductivity. The cooling sheet 33 absorbs heat from the first electronic component 24 and transfers the heat to the second shield 30. The cooling sheet 33 also functions as an insulator which prevents conduction between the first electronic component 24 and the second shield 30.

First portion 31 also comprises the recess 31a depressed toward the second electronic component 25 although this structure is not shown in FIG. 7. The cooling sheet 33 which absorbs heat from the second electronic component 25 and transfers the heat to the second shield 30 is provided between the recess 31a and the second electronic component 25. The cooling sheet 33 also functions as an insulator which prevents conduction between the second electronic component 25 and the second shield 30.

First portion 31 has a surface facing the second substrate 21. On this surface of first portion 31, insulator 34 is provided except for the position of the recess 31a. Insulator 34 is, for example, a sheet formed of an insulating resin material.

Figure 8:
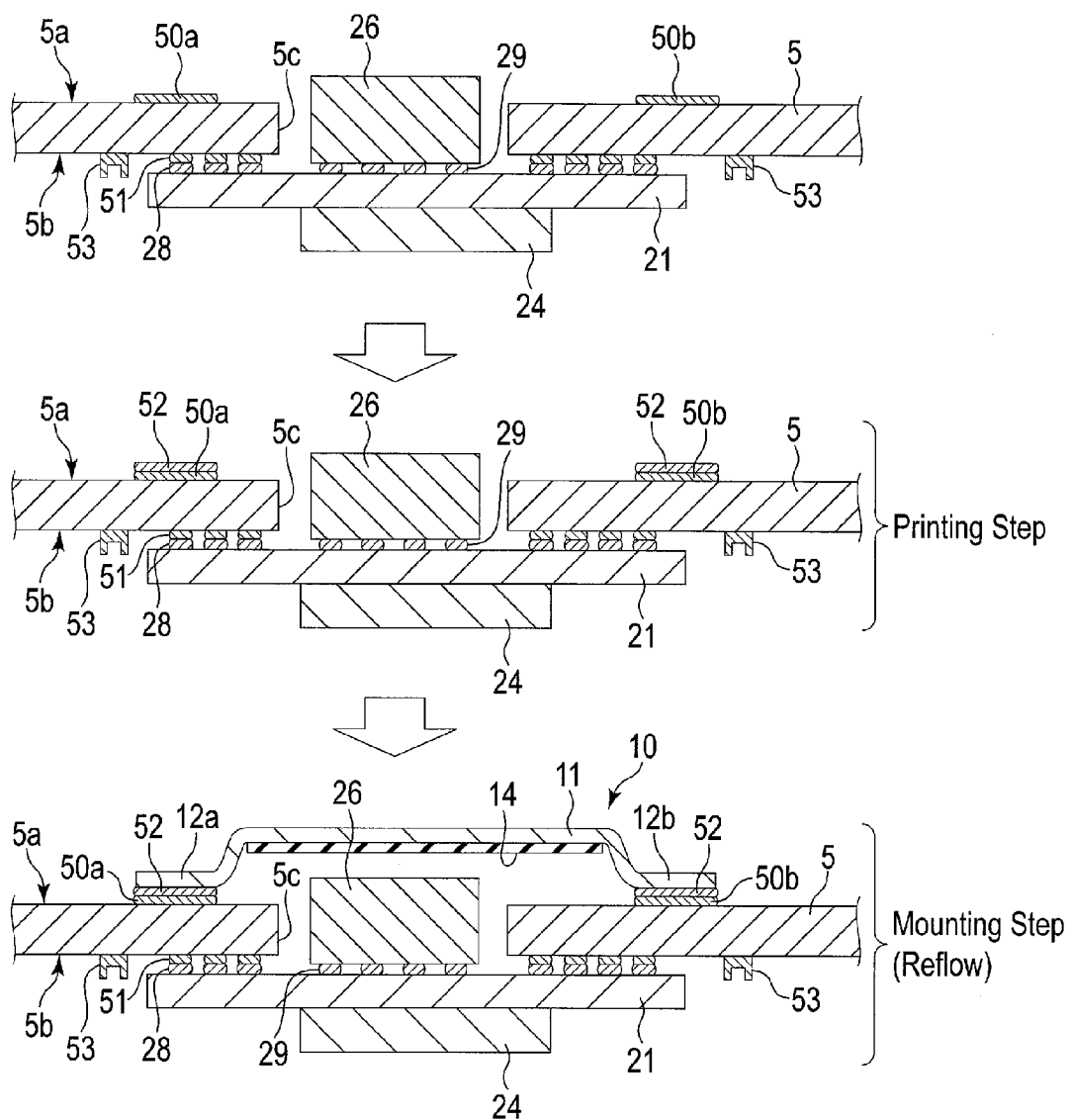
FIG. 8 shows examples of steps for mounting the first shield on the first substrate.

FIG. 8 shows examples of steps for mounting the first shield 10 on the first substrate 5. As shown in FIG. 8, firstly, the first substrate 5 on which the package 20 is mounted is prepared. Next, in a printing step, the solder 52 is printed in pads 50a, 50b, 50c, 50d, 50e and 50f provided on the first surface 5a.

After the printing step, in a mounting step, the first shield 10 is allocated in such a way that second portions 12a, 12b, 12c and 12d and third portions 13a and 13b are placed on pads 50a, 50b, 50c, 50d, 50e and 50f respectively.

After the mounting step, the solder 52 is melted through a reflow step. In this manner, second portions 12a, 12b, 12c and 12d and third portions 13a and 13b are fixed (coupled) to pads 50a, 50b, 50c, 50d, 50e and 50f respectively.

As stated above, the first shield 10 is formed of a material whose coefficient of linear expansion is close to that of the first substrate 5, such as stainless steel or nickel silver. Therefore, in the reflow step, following the thermal expansion and contraction of the first substrate 5, the first shield 10 is expanded and contracted. Thus, a large stress is difficult to be applied to the first substrate 5. Similarly, in the manufactured tablet computer 1, a stress which is applied to the first substrate 5 and produced by the thermal expansion and contraction of the first substrate 5 and the first shield 10 can be reduced.

Figure 9:
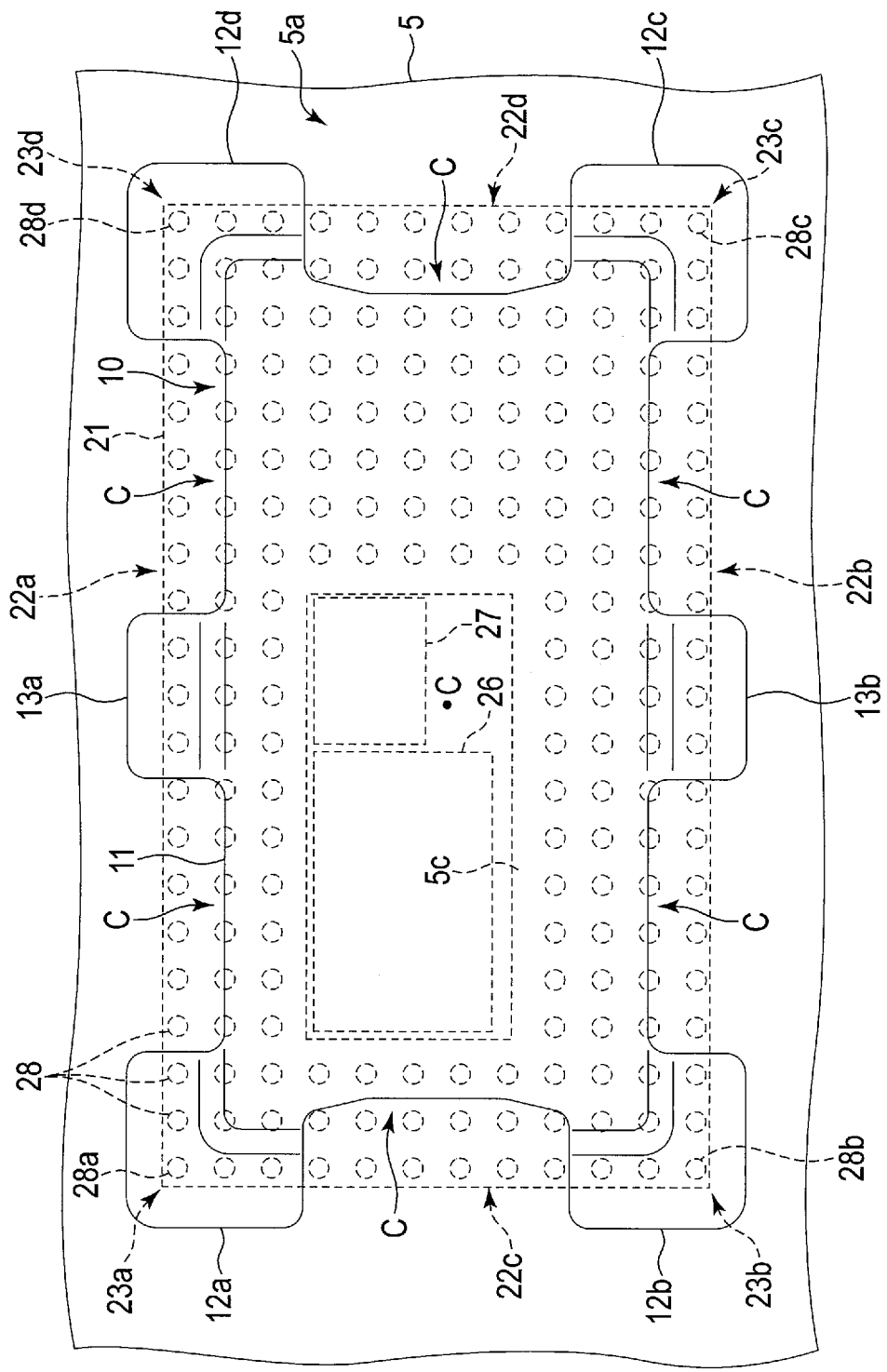
FIG. 9 schematically shows an example of the positional relationship between the package and the first shield.

The first shield 10 has a function for improving impact resistance of the tablet computer 1 in addition to the above-described function for improving electromagnetic compatibility. FIG. 9 is shown for explaining the function for improving the impact resistance, and schematically shows an example of the positional relationship between the package 20 and the first shield 10.

In the example of FIG. 9, bumps 28 are arranged in a matrix on the third surface 21a of the second substrate 21. Second portions 12a, 12b, 12c and 12d of the first shield 10 face corner portions 23a, 23b, 23c and 23d of the second substrate 21 respectively with the first substrate 5 being interposed. Third portions 13a and 13b of the first shield 10 face side portions 22a and 22b of the second substrate 21 respectively with the first substrate 5 being interposed.

Second portions 12a, 12b, 12c and 12d face bumps 28 located in the vicinity of corner portions 23a, 23b, 23c and 23d with the first substrate 5 being interposed. Specifically, second portions 12a, 12b, 12c and 12d face corner bumps 28a, 28b, 28c and 28d, which are located in the vicinity of corner portions 23a, 23b, 23c and 23d respectively. Of bumps 28 provided on the third surface 21a of the second substrate 21, corner bumps 28a, 28b, 28c and 28d are bumps 28 which are the closest to corner portions 23a, 23b, 23c and 23d respectively. Corner bumps 28a, 28b, 28c and 28d are examples of first bumps. Of bumps 28 provided on the third surface 21a, bumps 28 other than corner bumps 28a, 28b, 28c and 28d are examples of second bumps.

Second portion 12a, 12b, 12c or 12d does not face at least a part of bumps 28 other than corner bumps 28a, 28b, 28c and 28d (other than the first bumps). (In other words, second portion 12a, 12b, 12c or 12d does not face at least a part of the second bumps.) In the example of FIG. 9, second portions 12a, 12b, 12c and 12d face corner bumps 28a, 28b, 28c and 28d as well as a part of bumps 28 located in the outermost circumference. Second portion 12a, 12b, 12c or 12d does not face either bumps 28 located in the outermost circumference other than said part of bumps 28 located in the outermost circumference, or bumps 28 which are not located in the outermost circumference. The outermost circumference corresponds to, for example, columns and rows which are the farthest from the center (center C) of the second substrate 21.

Third portions 13a and 13b face a part of bumps 28 located in the outermost circumference with the first substrate 5 being interposed. Second portions 12a, 12b, 12c and 12d and third portions 13a and 13b may further face bumps 28 located in positions closer to center C than the outermost circumference.

In the example of FIG. 9, none of the outer circumferential frames of second portions 12a, 12b, 12c and 12d and third portions 13a and 13b (the frames on the sides distant from center C) faces the second substrate 21. These outer circumferential frames extend in positions more distant from center C than side portions 22a, 22b, 22c and 22d of the second substrate 21.

The impact resistance of the tablet computer 1 can be enhanced by the structures explained above. Specifically, since the rigidity of the first substrate 5 is enhanced by the affixing of second portions 12a, 12b, 12c and 12d and third portions 13a and 13b to the first substrate 5, the first substrate 5 and the package 20 are protected from the impact which is caused when the tablet computer 1 is dropped.

The inventor analyzed the stress which is applied to bumps 28 when an impact is added to the tablet computer 1 with a predetermined strength in a case where the first shield 10 is provided and in a case where the first shield 10 is not provided. As a result, the analysis reveals that the stress applied to bumps 28 changes over time substantially in line with the curves shown in FIG. 10.

In the analysis example of FIG. 10, the horizontal axis shows time passage from when the impact is added, and the vertical axis shows the magnitude of the stress applied to bumps 28. The solid curve indicates an analysis result in the case where the first shield 10 is provided. The broken curve indicates an analysis result in the case where the first shield 10 is not provided. According to these results, the peak of the stress applied to bumps 28 in the case where the first shield 10 is provided is less by substantially 25% than in the case where the first shield 10 is not provided. The figure shows that the first substrate 5 and the package 20 are protected by the first shield 10, thereby improving the impact resistance of the tablet computer 1.

In addition, the results show that the stress applied when the impact is added is especially large in corner bumps 28a, 28b, 28c and 28d and bumps 28 provided in the vicinity of these corner bumps.

The first shield 10 does not reinforce the entire range facing the third surface 21a of the second substrate 21 in the first substrate 5. The first shield 10 reinforces only the positions facing second portions 12a, 12b, 12c and 12d and third portions 13a and 13b. With this structure, it is possible to obtain a better effect of protecting the first substrate 5 and the package 20 than the case where the above-described entire range is reinforced by a shield whose size is equal to or greater than the third surface 21a.

In other words, the inventor discovered the following matters through experiments: the reinforcement of the above-described entire range enables enhancement of rigidity of the first substrate 5 in the range; however, the enhancement of rigidity does not necessarily extend the life duration of the first substrate 5 or the package 20. The inventor analyses reasons as follows.

For example, as is clear from FIG. 10, when the impact is applied to the circuit board, the stress which vibrates with a predetermined amplitude repeatedly affects the circuit board. In the case of the circuit board having a high rigidity, although the peak of the stress is lower than the circuit board having a low rigidity, the number of times of repeated application of the stress tends to be large. With respect to the life duration of the circuit board, in addition to the magnitude of the stress, the number of times of repeated application of the stress is one of the important factors. Therefore, the improvement of rigidity of the circuit board is a cause for reducing the life duration of the circuit board.

The structure of providing the first shield 10 which reinforces the entire range facing the third surface 21a of the second substrate 21 in the first substrate 5 is effective in static load. However, such a structure is not necessarily effective in vibration or impact (or heat), and may rather reduce the life duration of the first substrate 5 and the like. In the present embodiment, portions which are easily broken (mainly, the vicinity of corner bumps 28a, 28b, 28c and 28d) are reinforced by second portions 12a, 12b, 12c and 12d. The range facing first portion 11 or the range corresponding to gap C is not reinforced. Thus, the enhancement of rigidity of the first substrate 5 is kept to a minimum.

When, as shown in the example of FIG. 9, the outer circumferential frames of second portions 12a, 12b, 12c and 12d are more distant from center C than side portions 22a, 22b, 22c and 22d of the second substrate 21, stress waves from the end portion of the first substrate 5 to corner bumps 28a, 28b, 28c and 28d can be received outside corner bumps 28a, 29b, 28c and 28d. Thus, a stress-concentrated portion can be shifted to the outside of corner bumps 28a, 28b, 28c and 28d. When the first shield 10 is not provided, it is possible to reduce the loads of corner bumps 28a, 28b, 28c and 28d in which stress is the most easily concentrated, and the impact resistance can be further enhanced.

The provision of gap C in the first shield 10 may have a favorable influence on improvement in impact resistance as explained above. However, if gap C is too broad, the impact resistance may be reduced. If gap C is too broad, electromagnetic radiation may leak or intrude from gap C, and the effect of preventing EMI and RFI may not be sufficiently obtained. In the present embodiment, the size of gap C is restricted by the placement of third portion 13 in order to enhance the protection effect of the first substrate 5 and the package 20 and the effect of preventing EMI and RFI. These effects can be further enhanced if, as shown as third portions 13a and 13b in FIG. 9, third portion 13 is provided between second portions 12a and 12c facing the end portion of side portion 22a which is a long side, and between second portions 12b and 12d facing the end portion of side portion 22b which is a long side.

Apart from the above explanations, according to the present embodiment, the housing 2 can be made thinner. This effect is explained with reference to the comparison example of FIG. 11. In this figure, instead of the first shield 10, a shield 70 which has a different shape from the first shield 10 is attached to the first surface 5a of the first substrate 5.

The shield 70 comprises first portion 71 facing the third electronic component 26 and the fourth electronic component 27, and a plurality of second portions 72 which extend from first portion 71 and are connected to the first surface 5a of the first substrate 5. First portion 71 and second portion 72 are vertically connected. The shield 70 is formed of a conductive material and serves to prevent EMI and RFI as with the first shield 10.

The shield 70 is formed by, for example, folding a metallic material having a flat-plate shape. In the case where the shield 70 is formed by the folding process in this manner, even when the protrusion of the third electronic component 26 and the fourth electronic component 27 from the aperture portion 5c is slight, height h3 of second portion 72 needs to be long to some extent because of processing restrictions. As a result, the height (H1) between the first substrate 5 and the display 3 needs to be long. This prevents the tablet computer 1 from being reduced in size.

In the case where a drawing process is applied to a metallic material having a flat-plate shape, the first shield 10 having the shape shown in FIG. 5, FIG. 6 and the like can be manufactured, and further, the depth of drawing (the height from second portion 12 and third portion 13 to first portion 11) is easily adjusted. Therefore, it is possible to design the first shield 10 conforming to the height of the third electronic component 26 and the fourth electronic component 27 which protrude from the aperture portion 5c. Thus, it is possible to provide the thin tablet computer 1 in which the height (H1) between the first substrate 5 and the display 3 is shortened to a maximum extent.

Apart from the above explanations, various favorable effects can be obtained from the present embodiment.

Second Embodiment

A second embodiment is explained. Elements which are not described in particular are identical with those of the first embodiment. Explanations of the same or similar elements are omitted by adding the same reference numbers to such elements.

FIG. 12 schematically shows an example of the inner structure of a tablet computer 1 according to the second embodiment. The tablet computer 1 shown in this figure comprises first shield 210 and a plurality of first reinforcing plates 220 instead of first shield 10 and pads 50a, 50b, 50c, 50d, 50e and 50f. Each first reinforcing plate 220 is an example of a reinforcing portion, a metallic piece and a back plate.

Each first reinforcing plate 220 is fixed to, for example, a first surface 5a of a first substrate 5 via solder 230. First shield 210 is fixed to, for example, each first reinforcing plate 220 via solder 231. First shield 210 may be fixed to each first reinforcing plate 220 by using an adhesive agent and the like instead of solder 231.

For example, each first reinforcing plate 220 is thicker than first shield 210 and has a rigidity higher than first shield 210. Each first reinforcing plate 220 is formed of a conductive material whose coefficient of linear expansion is close to the first substrate 5. As this material, a metallic material such as stainless steel or nickel silver can be used.

First shield 210 is formed of a conductive material. For example, first shield 210 is a metallic sheet. As the material of the metallic sheet, for example, stainless steel or nickel silver can be employed.

The size of first shield 210 is configured to at least cover an aperture portion 5c. First shield 210 faces a third electronic component 26 and a fourth electronic component 27 which protrude from the aperture portion 5c. First shield 210 formed of a conductive material blocks electromagnetic radiation from a package 20 to the outside and electromagnetic radiation from the outside to the package 20.

In the example of FIG. 12, an insulator 214 is provided between the third electronic component 26 (the fourth electronic component 27) and first shield 210. The insulator 214 is, for example, a sheet formed of an insulating resin material, and blocks conduction between first shield 210 and each of the third electronic component 26 and the fourth electronic component 27.

FIG. 13 shows a structural example of vicinity of the aperture portion 5c of the first substrate 5 in the second embodiment. In the example of this figure, first reinforcing plates 220a, 220b, 220c and 220d are provided in the positions facing corner portions 23a, 23b, 23c and 23d of a second substrate 21 with the first substrate 5 being interposed. First reinforcing plates 220a, 220b, 220c and 220d are fixed to the first surface 5a of the first substrate 5 by solder 230 shown in FIG. 12.

First reinforcing plates 220a, 220b, 220c and 220d have substantially the same shapes and functions as second portions 12a, 12b, 12c and 12d of first shield 10 of the first embodiment. For example, like second portions 12a, 12b, 12c and 12d, first reinforcing plates 220a, 220b, 220c and 220d are L-shaped, and face corner bumps 28a, 28b, 28c and 28d provided in corner portions 23a, 23b, 23c and 23d respectively.

First reinforcing plates 220a, 220b, 220c and 220d may face a part of bumps 28 provided in the outermost circumference in addition to corner bumps 28a, 28b, 28c and 28d. First reinforcing plates 220a, 220b, 220c and 220d may further face bumps 28 provided in positions closer to center C than the outermost circumference.

The outer circumferential frames of first reinforcing plates 220a, 220b, 220c and 220d (the frames on the side distant from center C of the second substrate 21) do not face the second substrate 21. In other words, these outer circumferential frames extend in positions more distant from center C than side portions 22a, 22b, 22c and 22d of the second substrate 21.

The insulator 214 has a shape formed by cutting four corner portions of a rectangle having the same size as first shield 210 so as to correspond to first reinforcing plates 220a, 220b, 220c and 220d. First shield 210 has a rectangular shape along the outer circumferential frame of each of corner portions 23a, 23b, 23c and 23d.

Solder 230 shown in FIG. 12 is printed on the first surface 5a of the first substrate 5 in a first printing step. After the first printing step, first reinforcing plates 220a, 220b, 220c and 220d are mounted on each solder 230. Each solder 230 is melted through a reflow step, thereby fixing (coupling) first reinforcing plates 220a, 220b, 220c and 220d to the first surface 5a.

Solder 231 is printed on first reinforcing plates 220a, 220b, 220c and 220d in a second printing step. After the second printing step, the insulator 214 is provided between first reinforcing plates 220a, 220b, 220c and 220d, and first shield 210 is mounted on each solder 231. Each solder 231 is melted through a reflow step, thereby fixing (coupling) first shield 210 to first reinforcing plates 220a, 220b, 220c and 220d.

The structures of the second embodiment explained above can improve the electromagnetic compatibility and impact resistance of the tablet computer 1 in a way similar to that of the first embodiment.

By changing the thickness of first reinforcing plates 220a, 220b, 220c and 220d, the height from the first surface 5a to first shield 210 can be easily adjusted without being subject to processing restrictions. Therefore, it is possible to provide the thin tablet computer 1 in which the height (H1) between the first substrate 5 and a display 3 is shortened to a maximum extent.

Third Embodiment

This specification explains a third embodiment. The third embodiment is a modification example of the second embodiment. Elements which are not described in particular are identical with those of the first and second embodiments. Explanations of the same or similar elements are omitted by adding the same reference numbers to such elements.

FIG. 14 shows a structural example of vicinity of an aperture portion 5c of a first substrate 5 according to the third embodiment. In the example of this figure, second reinforcing plates 301a and 301b are further provided on a first surface 5a of the first substrate 5. Second reinforcing plate 301a is located between first reinforcing plates 220a and 220d. Second reinforcing plate 301b is located between first reinforcing plates 220b and 220c. An insulator 214 has a shape formed by cutting four corner portions of a rectangle having the same size as first shield 210 so as to correspond to first reinforcing plates 220a, 220b, 220c and 220d, and cutting two side portions so as to correspond to second reinforcing plates 301a and 301b.

Second reinforcing plates 301a and 301b have substantially the same shapes and functions as third portions 13a and 13b of first shield 10 of the first embodiment. For example, like second portions 13a and 13b, second reinforcing plates 301a and 301b are rectangular, and face a part of bumps 28 provided in the outermost circumference with the first substrate 5 being interposed. Second reinforcing plates 301a and 301b may further face bump 28 provided in a position closer to center C than the outermost circumference.

The outer circumferential frames of second reinforcing plates 301a and 301b (the frames on the side distant from center C of a second substrate 21) do not face the second substrate 21. In other words, these outer circumferential frames extend in positions more distant from center C than side portions 22a and 22b of the second substrate 21.

The same effect as the second embodiment can be obtained from the structures of the third embodiment explained above. Further, second reinforcing plates 301a and 301b have the same influence as third portions 13a and 13b of first shield 10 of the first embodiment, thereby enhancing the protection effect of the first substrate 5 and a package 20 and the effect of preventing EMI and RFI.

Fourth Embodiment

This specification explains a fourth embodiment. The fourth embodiment is a modification example of the second embodiment. Elements which are not described in particular are identical with those of the first and second embodiments. Explanations of the same or similar elements are omitted by adding the same reference numbers to such elements.

FIG. 15 shows a structural example of vicinity of aperture portion 5c of a first substrate 5 according to the fourth embodiment. In the example of this figure, an insulator 214 comprises aperture portion (second aperture portion) 214a in a position corresponding to a third electronic component 26 and a fourth electronic component 27. Aperture portion 214a has, for example, substantially the same shape as aperture portion 5c of the first substrate 5. In a state in which a first shield 210 is fixed to first reinforcing plates 220a, 220b, 220c and 220d with the insulator 214 being interposed, the upper surfaces of the third electronic component 26 and the fourth electronic component 27 pass through aperture portion 214a and make contact with the first shield 210.

The same effect as the second embodiment can be obtained from the structures of the fourth embodiment explained above. Further, when the upper surfaces of the third electronic component 26 and the fourth electronic component 27 make contact with the first shield 210, the heat of these electronic components is transferred to the first shield 210. Thus, the electronic components can be cooled. The heat transferred to the first shield 210 is released to, for example, the surrounding air. A fin (protrusion) extending on the display 3 side may be provided in the first shield 210 in order to enhance the release of heat.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a first substrate comprising a first surface, a second surface opposite to the first surface, and an aperture portion penetrating from the first surface to the second surface;
   a second substrate comprising a third surface which comprises corner portions, the second substrate being attached to the second surface;
   an electronic component which is mounted on the third surface, passes through the aperture portion, and protrudes from the first surface; and
   a first shield formed of a conductive material, the first shield comprising a first portion which faces the electronic component protruding from the first surface, and second portions, which extend from the first portion, are coupled to the first surface, and face the corner portions with the first substrate being interposed between the second portions and the corner portions, wherein
   the third surface comprises four side portions and four corner portions structured by the four side portions,
   the first shield comprises four second portions facing the four corner portions with the first substrate being interposed between the four corner portions and the first substrate, and
   the first shield further comprises a third portion, the third portion extending from the first portion between two adjacent second portions of the four second portions, the third portion being coupled to the first surface, and facing one of the four side portions with the first substrate being interposed between the third portion and the one of the four side portions.

2. The electronic device of claim 1, wherein
   the third surface is attached to the second surface via bumps configured to electrically connect the first substrate and the second substrate,
   the bumps comprise first bumps located in the corner portions and second bumps which are bumps other than the first bumps, and
   the second portions face the first bumps with the first substrate being interposed between the second portions and the first bumps, and do not face at least one of the second bumps.

3. The electronic device of claim 1, wherein
   the third surface has a rectangular shape comprising two long-side portions extending parallel to one another and two short-side portions extending parallel to one another, and
   the first shield comprises two third portions facing the two long-side portions with the first substrate being interposed between the two third portions and the two long-side portions.

4. The electronic device of claim 1, further comprising an insulator provided between the first portion and the electronic component.

5. The electronic device of claim 1, wherein
   the second substrate comprises a fourth surface opposite to the third surface,
   the electronic device further comprises a second shield attached to the second surface and covering the fourth surface, and wherein
   the second portions are attached to the first surface in positions closer to the aperture portion than a position in which the second shield is attached to the second surface.

6. The electronic device of claim 1, wherein an inner surface of a first of the four second portions faces an inner surface of a first of the four corner portions.

7. An electronic device comprising:
   a first substrate comprising a first surface, a second surface opposite to the first surface, and a first aperture portion penetrating from the first surface to the second surface;
   a second substrate comprising a third surface which comprises corner portions and is attached to the second surface;
   an electronic component which is mounted on the third surface, passes through the first aperture portion, and protrudes from the first surface;
   first reinforcing plates which are provided on the first surface and face the corner portions with the first substrate being interposed between the first reinforcing plates and the corner portions;
   a shield which is attached to the first reinforcing plates, faces the electronic component protruding from the first surface, and is formed of a conductive material; and
   an insulator provided between the shield and the electronic component, wherein
   the insulator comprises a second aperture portion, and
   the electronic component passes through the second aperture portion and makes contact with the shield.

8. The electronic device of claim 7, wherein
   the third surface is attached to the second surface via bumps configured to electrically connect the first substrate and the second substrate,
   the bumps comprise first bumps located in the corner portions and second bumps which are bumps other than the first bumps, and the first reinforcing plates face the first bumps with the first substrate being interposed between the first reinforcing plates and the first bumps, and do not face at least one of the second bumps.

9. The electronic device of claim 7, wherein
the third surface comprises four side portions and four corner portions structured by the four side portions, and
the electronic device comprises four first reinforcing plates facing the four corner portions with the first substrate being interposed between the four first reinforcing plates and the four corner portions.

10. The electronic device of claim 9, further comprising a second reinforcing plate which is provided on the first surface and faces one of the four side portions with the first substrate being interposed between the second reinforcing plate and the one of the four side portions.

11. The electronic device of claim 10, wherein
the third surface has a rectangular shape comprising two long-side portions extending parallel to one another and two short-side portions extending parallel to one another, and
the electronic device comprises two second reinforcing plates including said second reinforcing plate, the two second reinforcing plates facing the two long-side portions with the first substrate being interposed between the two second reinforcing plates and the two long-side portions.

* * * * *